United States Patent
Worley et al.

Patent Number: 6,147,857
Date of Patent: Nov. 14, 2000

[54] OPTIONAL ON CHIP POWER SUPPLY BYPASS CAPACITOR

[76] Inventors: Eugene Robert Worley, 11 Bowditch, Irvine, Calif. 92620-3305; Richard Arthur Mann, 808 Teri Ave., Torrance, Calif. 90503

[21] Appl. No.: 08/946,555

[22] Filed: Oct. 7, 1997

[51] Int. Cl.[7] .............................. H01G 4/002; H01G 4/30
[52] U.S. Cl. ...................... 361/301.2; 361/328; 361/313; 361/320; 361/308.3
[58] Field of Search ............................. 361/301.2, 306.3, 361/308.3, 311, 313, 328, 329, 763, 764, 320, 321.1–321.5; 257/665, 666, 524, 659, 660, 306, 307, 532

[56] References Cited

U.S. PATENT DOCUMENTS

| | | | |
|---|---|---|---|
| 4,598,307 | 7/1986 | Wakabayashi et al. | 257/75 |
| 4,737,830 | 4/1988 | Patel et al. | 357/23.6 |
| 4,864,464 | 9/1989 | Gonzalez | 361/313 |
| 4,929,989 | 5/1990 | Hayano | 357/23.6 |
| 4,937,649 | 6/1990 | Shiba et al. | 257/51 |
| 5,200,364 | 4/1993 | Loh | 437/209 |
| 5,482,897 | 1/1996 | Lynch | 437/209 |
| 5,590,017 | 12/1996 | Kelso | 361/321.4 |
| 5,598,029 | 1/1997 | Suzuki | 257/665 |
| 5,629,240 | 5/1997 | Shiba et al. | 257/51 |
| 5,652,693 | 7/1997 | Chou et al. | 361/306.1 |
| 5,730,835 | 3/1998 | Roberts et al. | 156/656.1 |
| 5,780,930 | 7/1998 | Malladi et al. | 257/777 |
| 5,834,348 | 11/1998 | Kwon et al. | 438/240 |

FOREIGN PATENT DOCUMENTS 2-260559  10/1990  Japan .......................................... 27/4

OTHER PUBLICATIONS

Coombs, "Printed Circuits Handbook", pp. 21.19–21.20, 1996.

*Primary Examiner*—Dean A. Reichard
*Assistant Examiner*—Eric Thomas

[57] ABSTRACT

An integrated circuit includes main power busses located on the next to the top most level of metal and a top level of metal separated from the main power busses by a thin dielectric. The top most level metal is connected to one of the power buses either through bond wires or through contacts. This structure provides a distributed bypass capacitance between the power buses thus stabilizing the power bus voltage within the integrated circuit. Furthermore, this capacitance structure can be optional and can be made with one or two masking steps.

3 Claims, 5 Drawing Sheets

OPTIONAL ON CHIP POWER SUPPLY BYPASS CAPACITOR

BACKGROUND OF THE INVENTION

1. Field of the Invention.

This invention relates to the field of semiconductor integrated circuits, and particularly to an improvement in constructing an on chip power supply bypass capacitor to suppress transient voltage spikes.

2. Description of the Related Art

Capacitance bypassing of an integrated circuit's power supply nodes is typically done in moderate to high speed applications in order to filter out transient voltage spikes which are a consequence of transient current flow due to logic switching. With larger die sizes and smaller geometry transistors current transients on integrated circuits have been increasing in magnitude as the technology evolves. Even the small inductance of package leads, bond wires, and chip interconnect wires causes an unacceptable amount of voltage spiking or bouncing which has a disruptive effect on logic and analog integrated circuits.

Capacitors can be placed on a printed circuit board near the integrated circuit's power pins, Vss and Vdd, but the transient suppression is limited by lead and bond wire inductance. Capacitors can also be placed in a package along side the chip die but bond wire inductance limits performance. U.S. Pat. No. 5,629,240 a means is described of attaching a power supply bypass capacitor directly on to a chip in order to reduce parasitic inductance.

The most ideal capacitor associated with chip power bus bypassing is one which distributes the capacitance over the chip's power supply lines or wires and, correspondingly, offers very little parasitic inductance. With a large distributed "on' chip capacitor it is possible to reduce the number of power pins since multiple power pins for a given power bus are largely a consequence of the need to reduce package pin and bond wire inductance. Another desirable quality of a large distributed power bus bypass capacitor is to improve Electrostatic Discharge (ESD) protection when pad diode clamps to ground and power are used.

There are patents that describe "on" chip means to build ground to power bus capacitors including MOS capacitors and metal-insulator-metal capacitors. U.S. Pat. No. 4,937,649 a metal-insulator-metal capacitor is described in which one level of metal is used for both ground routing and as a bypass capacitor plate and a second level of metal is used for power routing and as the second bypass capacitor plate. The disadvantage of this scheme is that it requires more than two additional masking steps in order to create the two metal levels and the metal connections to the lower levels of metal in a multi-metal integrated circuit.

SUMMARY OF THE INVENTION

According to the present invention, there is provided a semiconductor integrated circuit comprising a semiconductor substrate, at least two power supply buses which provide power to logic gate, memory cells, analog circuits, etc., and a capacitor distributed between the power supply buses. One side of the capacitor has a large plate which is electrostaticly coupled to a plurality of plates connected to the ground and power pins. The plurality of ground and power plates also act as normal power distribution wires for underlying circuitry. Furthermore, the large capacitor plate is connected via one or more bond wires to either ground or to a power rail. Alternately, the large capacitor plate can be connected to one of the power rails by adding a contact step which requires adding a masking step. Between the large capacitor plate and the plurality of ground and power plates there is a deposited dielectric material. The capacitor structure requires the application of only one mask to fabricate. In addition, the circuit can be laid out so as to use the capacitor layer as a option. That is, this "on" chip power bus bypass capacitor can either be applied or omitted without affecting the layout of the integrated circuit unlike other approaches. Thus, if it is determined that a given chip does not require the capacitor layer then this layer and its associated masking step and processing steps can be omitted in the interest of reducing cost. On the other hand, this layer can be applied if it is determined that a high degree of power bus capacitive bypassing is required.

In accordance with the present invention, since the capacitor is distributively connected between the ground and power supply wires or rails, the transient voltage spikes are significantly attenuated throughout the circuitry of the integrated circuit. Furthermore, chip pin tolerance to Electro-Static Discharge (ESD) is improved by the capacitor providing a power to ground current shunt path.

PRIOR ART STATEMENT

U.S. Pat. No. 4,937,649. This patent describes a power bus capacitor formed with two layers of metal where one is ground or Vss and the other is Vdd. The capacitor plates are also use as major buses.

U.S. Pat. No. 4,737,830. This patent describes how to build a Vcc to Vss power bus capacitor using a thin, thermally grown oxide over a semiconductor.

U.S. Pat. No. 5,587,333. This patent describes how to build an "on" chip power supply bypass capacitor using a MOS capacitor.

U.S. Pat. No. 5,482,897. This patent describes how a chip ground plane is created by depositing and patterning metal on top of the chip.

DETAILED DESCRIPTION OF THE PREFERRED EMBODIMENTS

With the introduction of Chemical Mechanical Polishing (CMP) multiple levels of metal are available in the manufacture of integrated circuit. A common practice for a process with several levels of interconnect metal is to reserve the top most layer for major power bus routing.

Figure 1:
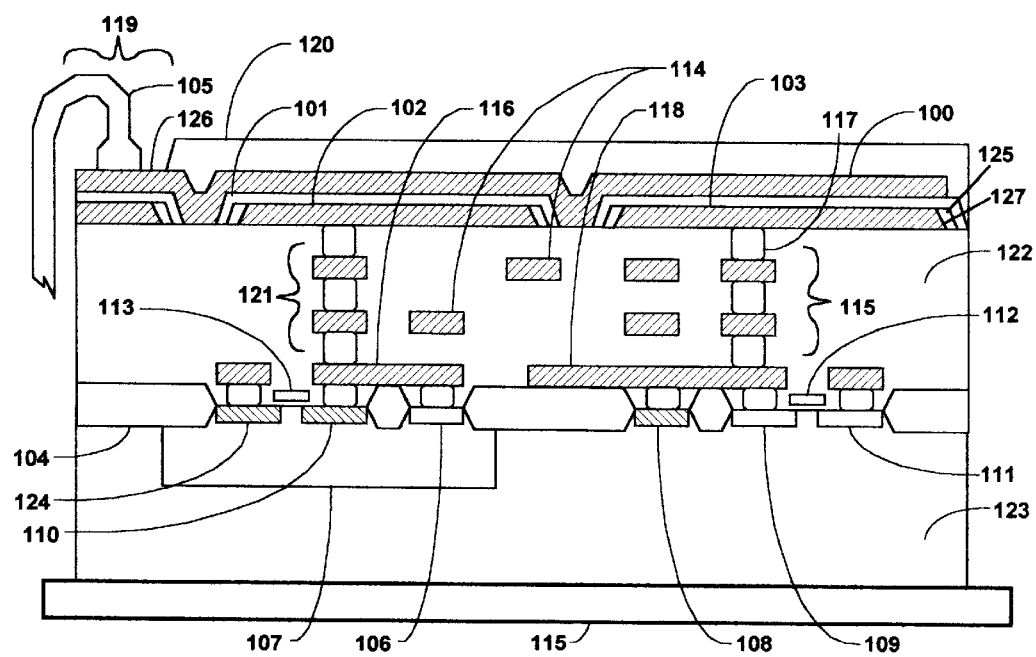
FIG. 1 shows a cross section diagram of the proposed "on" chip bypass capacitor including details of structures found in a standard CMOS process.

FIG. 1 shows a cross section diagram of the proposed "on" chip bypass capacitor. The cross section includes structural features normally associated with a standard P substrate, locos isolated, CMOS process. In this example there are 4 levels of CMP metal which are used for interconnect and a 5th or top layer metal 100 which is used as a capacitor plate. The main power 102 and ground 103 distribution rails or Vdd and Vss, respectively, are routed exclusively in the 4th level of metal. The 4th level metal functions as a plurality of capacitor plates separated from the top capacitor plate 100 by a thin dielectric. The thin capacitor dielectric can be realized using such readily available process materials such as, but not limited to, silicon nitride, deposited oxide, Oxide-Nitride-Oxide (ONO), etc. The top capacitor plate 100 is connected to either Vss or Vdd via a bond wire. Note that a pad opening 119 is made in the overcoat protective layer 120 so that the bond wire 105 can be attached to the top capacitor plate 100. If it is connected to Vss a capacitor is formed between the Vdd rails 102 and the top capacitor plate 100. Conversely, if the top capacitor plate 100 is connected to Vdd then a capacitor is formed between the Vss rails 103 and the top capacitor plate 100.

Interlevel connecting stack 121 connects the main Vdd bus 102 to the local Vdd bus 116 and interlevel connecting stack 115 connects main Vss 103 to the local Vss bus 118. The interlevel connecting stacks 121 and 115 are comprised of tungsten plugs 117 and other metal layers 114 which, in the case shown in FIG. 1, are levels 2 and 3. Also shown in FIG. 1 are the thick inter level dielectric 122, field oxide associated with a locos process 104, the gate 113 of a PFET, the P+ source 110 of a PFET which is connected to the local Vdd 116, the N+ well of a PFET 107, the N+ well tie 106 which connects to the local Vdd bus 116, the drain of the PFET 124, a P+ substrate tie 108 which is connected to the local Vss 118, an N+ source 109 of an NFET, the gate 112 of an NFET, the drain 111 of the NFET, and examples of inter level metal signal interconnect 114 on metal levels 2 and 3. The silicon substrate 123 is attached to the die plate or floor 115 of the chips encapsulating package which is connected to Vss via the lead frame. The protective overcoat insulating layer 120 is shown on top of the capacitor plate metal 100.

The cross section of FIG. 1 is for illustration purposes. It is acknowledged that the capacitor forming techniques defined here can be applied to processes with any number of metal layers, to any isolation scheme such as shallow trench isolation, and, in general, to any type of semiconductor process including bipolar, GaAs, SOI, etc.

To make the capacitor according to this invention the following steps are taken. The starting point for this discussion is after metal layer 102/103 has been deposited and patterned. It is assumed the metal level comprising 102 and 103 is the last normal level of metal required to realize a given integrated circuit without a metal to metal internal capacitor and that the main Vdd and Vss lines are routed on this level. A thin dielectric 101 is then deposited over the Vdd/Vss conductors, 102 and 103, respectively. Next, metal 100 is deposited over the thin dielectric and patterned with a mask. The capacitor metal layer 100 includes a pad layout where a pad mask opening 119 has been applied. A bond wire 105 is connected from the pad from a bonding pad 126 associated with the capacitor plate 100 to either Vss or Vdd of the package or to a Vss/Vdd pad on the last normal metal or to the pad floor. It is acknowledged that more than one pad connection to the capacitor metal plate 100 can be made depending on capacitor performance and available space.

To provide for good metal step coverage of the top capacitor plate 100 over the Vdd 102 and Vss 103 busses one of two steps can be taken. One to form a spacer 125 at the edge of the Vdd 102 and Vss metal lines. The spacer is formed by depositing a thick insulating film such as, but not limited to, oxide or nitride. The insulator is then selectively etched such that the insulator is no longer on top of the Vdd 102 or Vss 103 metal. Due to the differential thickness of the deposited film on topography, there will be residual insulator material clinging to the edges of the Vdd 102 and Vss 103 metal. The spacer thus formed will provide a more gradual slope for the top plate capacitor 100 metal. Another method is to perform a sloped etch on the metal layer used to form Vdd 102 and Vss 103. A positive slope 127 on the edges of this metal layer will provide better step coverage for the top capacitor plate.

Figure 2:
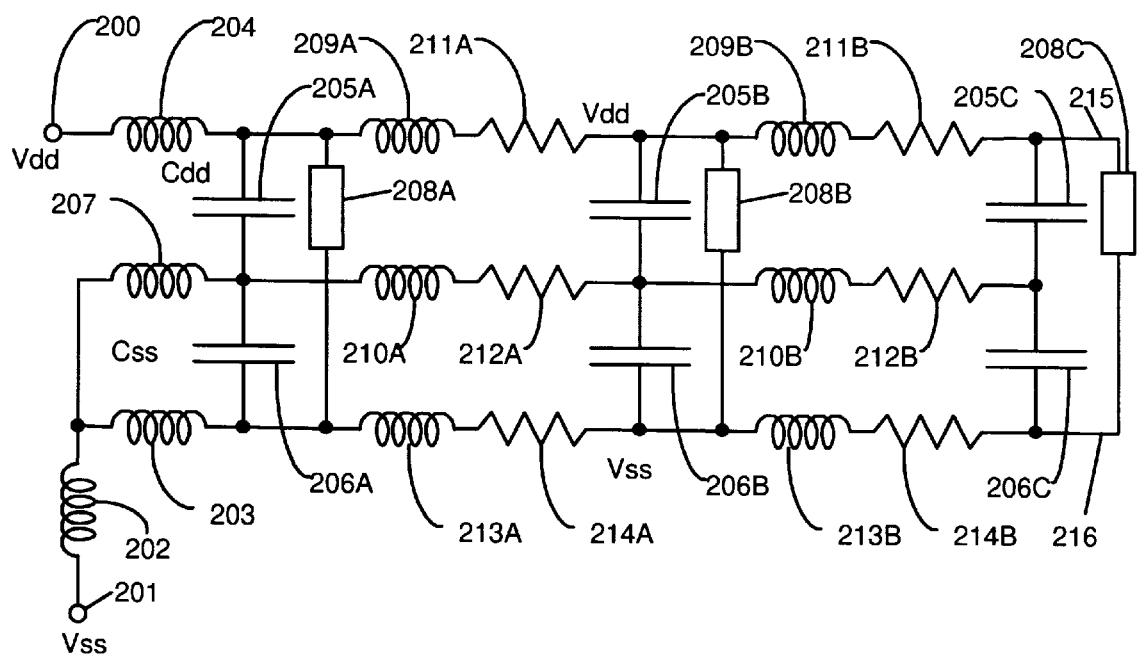
FIG. 2 is a schematic diagram of an example of the proposed bypass capacitor-power bus architecture represented in FIG. 1.

FIG. 2 is a schematic diagram showing an example of the proposed bypass capacitor-power bus architecture represented in FIG. 1. Terminal 200 represents the point at which Vdd is applied to the package pin and terminal 201 represents the point at which Vss is applied to the package pin. Inductor 204 represents the package lead and bond wire inductance in bringing Vdd from the package pin to the internal chip Vdd bus. Inductor 202 represents package lead inductance in bringing Vss form the package pin to the package's bonding pad. In this example it is assumed that the top most metal level which is the capacitor plate is wire bonded to the Vss pad of the package along with the chip's Vss. Symbols 208A, 208B, and 208C represent the load presented to the power supply by chip's circuitry. Inductor 203 represents the bond wire inductance in going from the Vss bond pad on the package to the Vss bond pad of the chip and inductor 207 represents the inductance in going form the Vss bond pad on the package to the bond pad of the top level metal 100 or top capacitor plate of the chip. Capacitors 205A, 205B and 205C are a lumped element representation of the distributed capacitance existing between the top metal capacitor plate 100 and the Vdd bus 102 and capacitors 206A, 206B, and 206C are a lumped element representation of the distributed capacitance between the top metal capacitor plate 100 and the Vss bus 103. Inductors 209A and 209B and resistors 211A and 211B are the lumped element representation of the distributed inductance and resistance of the chip's main Vdd bus 102. Inductors 213A and 213B and resistors 214A and 214B are the lumped element representation of the distributed inductance and resistance of the chip's main Vss bus 103. Finally, inductors 210 and resistors 212A and 212B are the lumped element representation of the distributed inductance and resistance of the chip's top metal capacitor plate 100. Note that for the Vdd node 215 and Vss node 216 remote from the bonding pads that there is local capacitive coupling between these power supply nodes via capacitors 205C and 206C. Thus, the effects of the parasitic inductances including various inductances such as that due to bond wires, package leads, and chip wiring and the effects of parasitic bus resistance is mitigated by the distributed capacitance of the invention while only costing one masking step. It should be noted that the reason for bonding out the top metal capacitor plate is to prevent it from floating and thereby charging via electrostatic induction.

Figure 3:
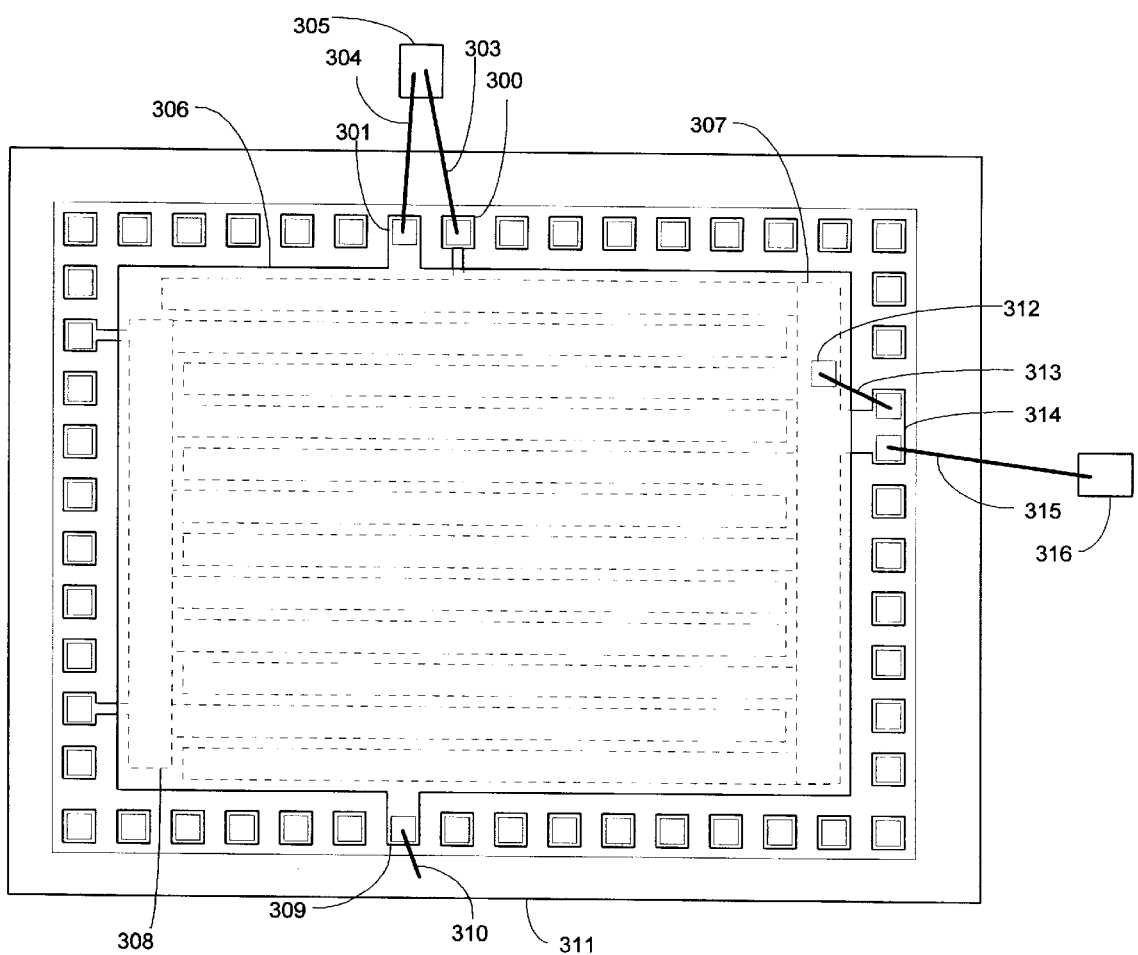
FIG. 3 shows three different methods of bonding the top capacitor plate to a power rail which in this example is Vss.

FIG. 3 shows a top down view of the proposed capacitor structure. The top capacitor plate 306 covers the underlying Vdd 308 and Vss 307 buses. Three different methods of bonding the top plate to a power terminal are illustrated. In the example shown the top capacitor plate is tied to Vss although it could have been tied instead to Vdd.

At the top of the diagram the capacitor plate 306 ties to a Vss package pad 305 via a bond wire 304 and a pad 301 which is directly connected to the top capacitor plate 306. Another bond wire 303 is shown which connects a chip Vss pad 300 to the shared package Vss pad 305. It is also possible that the top capacitor plate 306 does not have to share a package Vss pad with a Vss chip pad if there is a sufficient number of pads available.

On the right hand side of the diagram another method of bonding is illustrated. In this case a bond wire 315 is run from a package Vss pad 316 to a chip Vss pad 314. On the same pad 314 which has two bonding sites there is a bond wire 313 connecting to a capacitor plate pad 312. The capacitor plate pad is made by using a pad mask opening 312. Note that Vss metal 307 is under the capacitor plate pad 312. This is done so that if the thin capacitor dielectric material 101 fails due to the bonding pressure there would exist a harmless short from the capacitor plate to Vss.

Finally, on the bottom of the diagram a bond wire 310 connects a capacitor plate pad 309 to the package floor metal plate 311. This scheme assumes that the package floor metal is attached to Vss which is typical for the common P substrate CMOS process.

It should be noted that holes or openings can be etched into the capacitor plate 306 if some part of the upper metal interconnect layer is used for signal routing as well as for Vss 307 and Vdd 308. Using this layer for signal interconnect is feasable provided most of this layer is used for power bus routing so that a significant amount of power bus bypass capacitance can be created using the capacitor plate layer 306. Also, multiple independent power busses can make use of the capacitor plate by patterning the plate layer into several separate plates with separate pad connections which correspond to the particular power bus set being bypassed.

Figure 4:
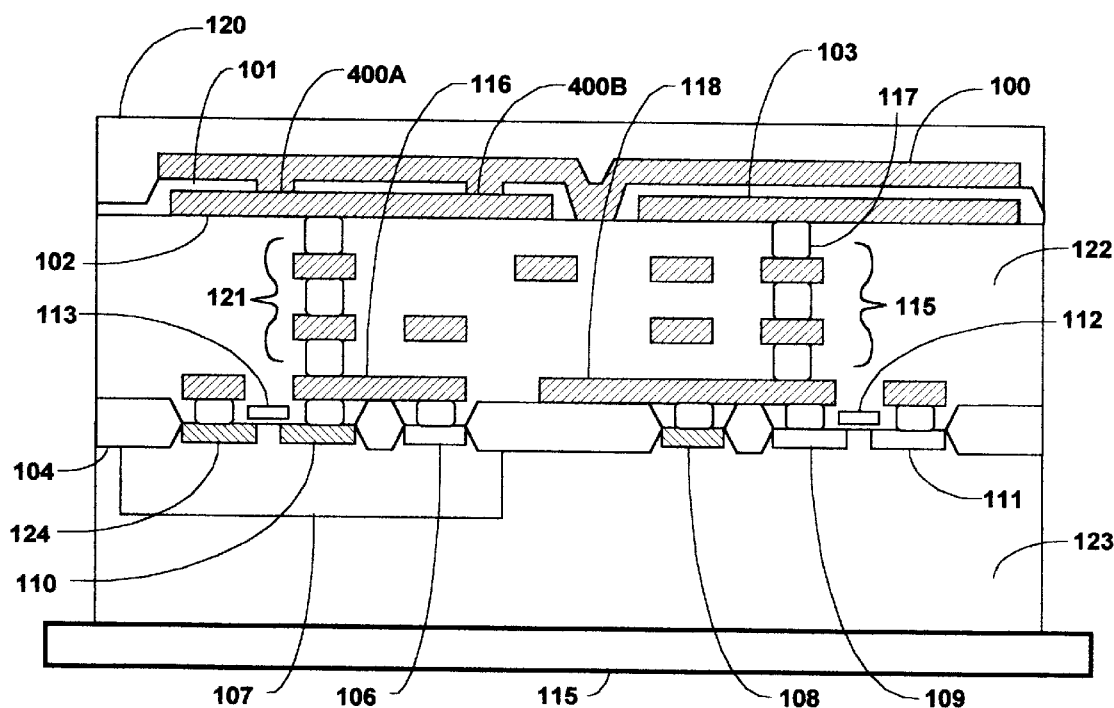
FIG. 4 shows an alternate version of the bypass capacitor in which contacts are used to connect the top capacitor plate to a power rail rather than using bonding wires.

FIG. 4 shows an alternate version of the bypass capacitor. In this case another masking layer has been added to form contacts 400A and 400B between the upper capacitor plate 100 and, in the case shown, the Vdd main bus line 102. It is acknowledged that this connection could have been made to Vss instead of Vdd. The advantage in adding the contacts 400 is the elimination of the wire bond(s) and the increase in local capacitance since local electrostatic coupling from Vdd to Vss is done through one dielectric thickness instead of two.

Both the one and two mask versions of the "on" chip power supply capacitor of the invention can be implemented as an option. That is, the given chip can be made either with or without the bypass capacitor. If it is determined that the power bus bypass capacitor is not needed then the masking steps associated with the capacitor can be eliminated for the sake of cost. The determination of whether to include the capacitor in production can be made by making wafer splits with and without the capacitor layer. Performance comparisons can then be made which include speed, yield, ESD tolerance, etc.

A desirable quality of having a large, "on" chip capacitor is improved ESD protection. The top most metal level 100 acts as a capacitor plate in the Charge Device Model (CDM) test. In FIG. 1 the CDM chip coupling will be to Vss for any charged external metal object at the bottom of the package because of the package's substrate tie plate 115 or to the capacitor plate metal 100 for any charged metal object at the top of the package.

Figure 5:
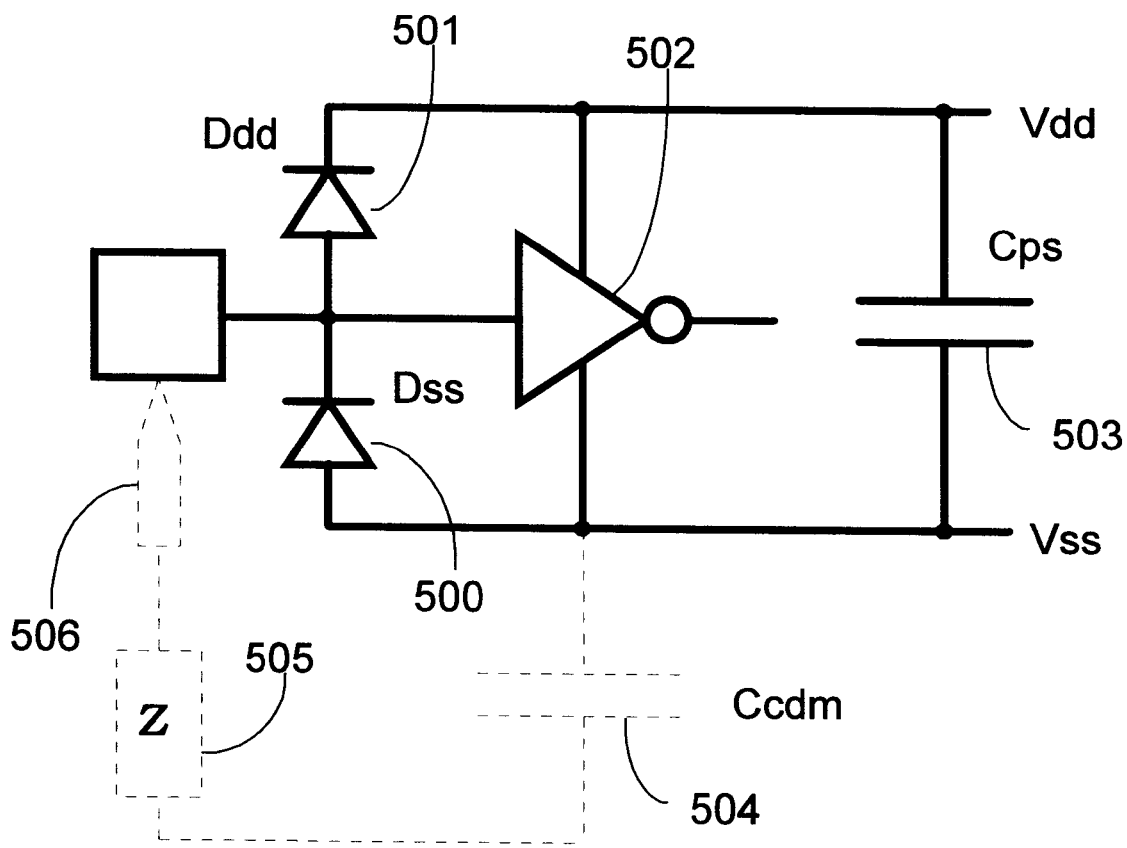
FIG. 5 shows an equivalent circuit diagram associated with the Charge Device Model used in ESD testing interacting with the power bus capacitor.

FIG. 5 is a schematic diagram of a pad protected by an N+/substrate diode Ddd 500 whose anode is connected to Vss and by a P+ well diode Ddd 501 whose cathode is connected to Vdd. Inverter 502 is being protected by the diodes during an ESD event. Cps 503 represents the aforementioned Vdd to Vss bypass capacitor and other Vdd to Vss capacitances such as well to substrate junction capacitance. For the sake of this discussion, Cps is shown without parasitics. Also shown is a CDM capacitor (Ccdm) 504 and its discharge impedance element 505. For test purposes, Ccdm 504 is formed by placing a packaged chip on a metal plate which capacitively couples to the die surface through the chip package material. The capacitance Ccdm 504 is determined by the die area, the thickness of the package material, and the dielectric constant of the package material. The discharge impedance 505 is determine by the arc resistance, electromagnetic radiation, and parasitic inductances such as lead and bond wire inductance. Ccdm is typically a few pico Farads (pFs).

The CDM discharge is made with a probe 506 which is grounded to the plate. The probe 506 is brought into contact with a package pin of a die which has been charged slowly to some potential. Cdcm 504 then rapidly discharges into the package pin. For a positive CDM voltage on the external plate Dss 500 conducts. For a negative CDM voltage on the external plate Ddd 501 conducts and charges Cps 503.

For future processes the operating voltage of integrated circuits are expected to be as low as 1.0V with gate oxide thicknesses of about 30A. The thin gate dielectric means that the voltages inside the chip must clamped to only a few volts during an ESD transient. In CDM the peak current can be several amps. To keep the internal voltage with a few volts thus preventing a catastrophic oxide rupture the impedance of the chip components, i.e. the pad diodes 500 and 501 and bus coupling capacitance must be low. The diode "on" resistance can be designed to be a couple of tenths of an ohm so that less than 2 volts will be dropped across it for a 5 amp CDM discharge. The voltage dropped across Cps during a positive voltage CDM discharge can be very small depending on the size of Cps 503 relative to Ccdm 504. For reasonable dielectric thicknesses of the bus bypass capacitor, a Cps to Ccdm ratio of several thousand can be achieved which attenuates the CDM discharge voltage by that amount if parasitics are ignored.

Human Body Model discharges are also favorably impacted by a large on chip power supply bypass capacitor. In the HBM a 100 pF capacitor is used as the stress source with a source resistance of 1.5 KΩ. Thus, the attenuation factor for an HBM discharge is on the order of several hundred to one.

What is claimed is:

1. A semiconductor integrated circuit comprising:

a semiconductor substrate;

circuits formed on said substrate;

power rails and ground rails formed on said substrate, each of said rails being used to supply power for said circuits and said rails being formed on a top most interconnect metal layer of said circuits;

an insulating layer formed on said substrate over said power and ground rails;

a metal layer formed on said insulating layer acting as a top capacitor plate with said power and ground rails acting as a lower capacitor plate and said metal layer substantially covering said rails thereby forming a power supply bypass capacitor;

means for connecting said top capacitor plate to at least one of said power rails or to at least one of said ground rails;

said means for connecting said top capacitor plate to at least one of said power rails or to at least one of said ground rails comprising a bond wire leading from a bond pad connected to said top capacitor plate to a bond pad connected to at least one of said power rails or to at least one of said ground rails.

2. A semiconductor integrated circuit comprising:

a semiconductor substrate;

circuits formed on said substrate;

power rails and ground rails formed on said substrate, each of said rails being used to supply power for said circuits and said rails being formed on a top most interconnect metal layer of said circuits;

an insulating layer formed on said substrate over said power and ground rails;

a metal layer formed on said insulating layer acting as a top capacitor plate with said power and ground rails acting as a lower capacitor plate and said metal layer substantially covering said rails thereby forming a power supply bypass capacitor;

means for connecting said top capacitor plate to at least one of said power rails or to at least one of said ground rails;

said means for connecting said top capacitor plate to at least one of said power rails or to at least one of said ground rails comprising a bond wire leading from a bond pad connected to said top capacitor plate to a bond pad located on a package which connects to a power pin or to a ground pin.

3. A semiconductor integrated circuit comprising:

a semiconductor substrate connected to a package floor metal plate;

circuits formed on said substrate;

power rails and ground rails formed on said substrate, each of said rails being used to supply power for said circuits and said rails being formed on a top most interconnect metal layer of said circuits;

an insulating layer formed on said substrate over said power and ground rails;

a metal layer formed on said insulating layer acting as a top capacitor plate with said power and ground rails acting as a lower capacitor plate and said metal layer substantially covering said rails thereby forming a power supply bypass capacitor;

means for connecting said top capacitor plate to at least one of said power rails or to at least one of said ground rails;

said means for connecting said top capacitor plate to at least one of said power rails or to at least one of said ground rails comprising a bond wire leading from a bond pad connected to said top capacitor plate to said package floor metal plate.

* * * * *